United States Patent
Hanaoka

(10) Patent No.: US 12,433,012 B2
(45) Date of Patent: Sep. 30, 2025

(54) SEMICONDUCTOR DEVICE

(71) Applicant: SANKEN ELECTRIC CO., LTD., Niiza (JP)

(72) Inventor: Masayuki Hanaoka, Niiza (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 439 days.

(21) Appl. No.: 18/063,119

(22) Filed: Dec. 8, 2022

(65) Prior Publication Data

US 2023/0307445 A1    Sep. 28, 2023

(30) Foreign Application Priority Data

Mar. 23, 2022    (JP) ................. 2022-047592

(51) Int. Cl.
*H10D 84/60*      (2025.01)
*H10D 8/00*       (2025.01)
*H10D 12/00*      (2025.01)
*H10D 64/00*      (2025.01)

(52) U.S. Cl.
CPC ........... *H10D 84/617* (2025.01); *H10D 8/422* (2025.01); *H10D 12/481* (2025.01); *H10D 64/117* (2025.01)

(58) Field of Classification Search
CPC .... H10D 84/617; H10D 8/422; H10D 12/481; H10D 64/117; H10D 8/00; H10D 12/038; H10D 62/10; H10D 84/811
See application file for complete search history.

(56) References Cited

U.S. PATENT DOCUMENTS

2021/0376167 A1*  12/2021  Soneda .................. H10D 8/422

FOREIGN PATENT DOCUMENTS

JP    2015-109341 A    6/2015

* cited by examiner

*Primary Examiner* — Mohammad A Rahman
(74) *Attorney, Agent, or Firm* — METROLEX IP LAW GROUP, PLLC; Robert L. Scott, Esq.

(57) ABSTRACT

A semiconductor device according to one or more embodiment may include: an IGBT region including a first semiconductor region of a first conductivity type; a second semiconductor region of a second conductivity type arranged on the first semiconductor region; a third semiconductor region of the first conductivity type arranged on the second semiconductor region; a fourth semiconductor region of the second conductivity type arranged on the first semiconductor region and opposite the second semiconductor region; and a control electrode that is arranged via an insulating film opposite the second semiconductor region; and a diode region comprising a fifth semiconductor region of the second conductivity type on the first semiconductor region. In the semiconductor device according to one or more embodiments, an impurity concentration of the fifth semiconductor region may be lower than the impurity concentration of the second semiconductor region.

4 Claims, 2 Drawing Sheets

SEMICONDUCTOR DEVICE

CROSS REFERENCE TO RELATED APPLICATIONS

This application claims priority based on 35 USC 119 from prior Japanese Patent Application No. 2022-047592 filed on Mar. 23, 2022, entitled "SEMICONDUCTOR DEVICE", the entire contents of which are incorporated herein by reference.

BACKGROUND

The disclosure relates to a semiconductor device, in particular, to a semiconductor device in which an IGBT (Insulated Gate Bipolar Transistor) and an FWD (Free Wheeling Diode) are connected in reverse parallel and in which a reverse direction peak current (Irpeak) may be reduced.

A semiconductor device that connects the IGBT and the FWD in reverse parallel is known as a switching element to drive a motor, etc. The FWD connected in reverse parallel to the IGBT serves to protect the IGBT from the return current caused by the back electromotive force generated by a coil of a motor, etc.

A reverse conduction IGBT (RC-IGBT) that forms an IGBT region and an FWD region on the same semiconductor substrate to reduce size and a bonding wire is known. In order to improve the operating characteristics of the reverse conduction IGBT, the IGBT region and the FWD region, which are formed on the same semiconductor substrate, are improved respectively. In the reverse conduction IGBT disclosed in Japanese published unexamined application No. 2015-109341 (Patent Document 1), in the FWD region, a P anode layer 36 and an N+ carrier control layer 44 are provided with a higher impurity concentration than an anode region 34. Therefore, it is described that the forward current in the FWD region is increased, the switching speed during FWD operation is improved, and the higher speed is achieved.

However, when the reverse direction peak current (Irpeak) in the FWD region is reduced in the semiconductor device disclosed in Patent Document 1, the impurity concentration in a base region also needs to be reduced, which causes to reduce the threshold voltage of the IGBT and load short-circuit tolerance.

SUMMARY

A semiconductor device according to one or more embodiment may include: a diode region including a first semiconductor region of a first conductivity type; a second semiconductor region of a second conductivity type arranged on the first semiconductor region; a third semiconductor region of the first conductivity type arranged on the second semiconductor region; a fourth semiconductor region of the second conductivity type arranged on the first semiconductor region and opposite the second semiconductor region; an IGBT region comprising a control electrode that is arranged via an insulating film opposite the second semiconductor region; and a fifth semiconductor region of the second conductivity type on the first semiconductor region. In the semiconductor device according to one or more embodiments, an impurity concentration of the fifth semiconductor region may be lower than the impurity concentration of the second semiconductor region.

A semiconductor device according to one or more embodiments may reduce the reverse direction peak current (Irpeak) of the reverse conduction IGBT without reducing the threshold voltage of the IGBT and load short-circuit tolerance.

DETAILED DESCRIPTION

Figure 1:
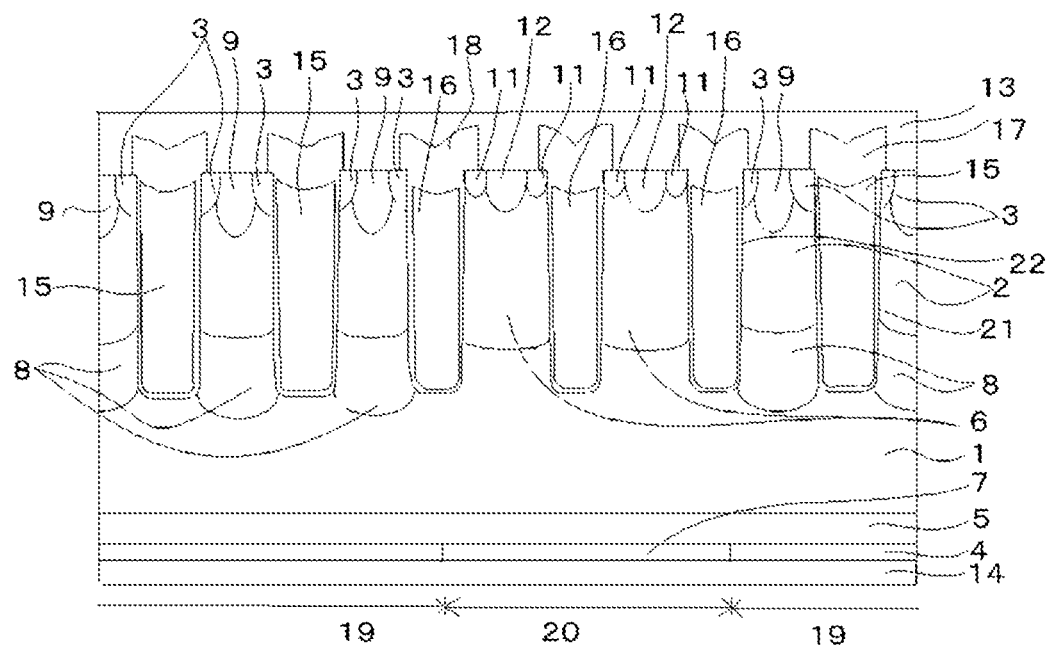
FIG. 1 is a cross-sectional view illustrating a semiconductor device according to one or more embodiments.

A semiconductor device according to one or more embodiments is described in detail with reference to drawings. However, the disclosed embodiments are exemplary and do not limit the scope of the invention.

With reference to drawings, one or more embodiments are described in detail. The description in the drawings is schematic, and the relationship between thicknesses and dimensions, and the ratio of thicknesses of each layer are examples, and do not limit the technical concept of the invention. In addition, the relationship and ratio of the dimensions may differ among the drawings. In the following description, "top", "bottom", "right side", "left side", etc. are used as necessary based on the orientation of the drawing to which reference is made when explaining the positional relationship of components, but they do not limit the technical concept of the invention. In addition, "top," "bottom," "right side," "left side," etc., may be used even when the parts are not in contact with each other. The "impurity concentration" may mean the effective concentration of an impurity element that contributes to the conductivity of a semiconductor. For example, when a semiconductor includes an n-type impurity element as a donor and a p-type impurity element as an acceptor, the "impurity concentration" may be defined as a concentration of one impurity element excluding the offset by the other element. The impurity concentration of a semiconductor layer or a semiconductor region may mean the maximum impurity concentration in each semiconductor layer or each semiconductor region, unless otherwise specified.

FIG. 1 is a diagram illustrating a semiconductor device according to one or more embodiments. A semiconductor device of FIG. 1 includes an IGBT region 19 and a diode region 20 of an FWD. The diode region 20 is sandwiched between the IGBT region 19. The IGBT region 19 and the diode region 20 may be provided alternately, or the diode region 20 may be provided to surround at least part of the IGBT region 19 from the outside by viewing the semiconductor device in a plan view.

The IGBT region 19 includes a drift region 1 of a first conductivity type (N-type), a base region 2 of a second conductivity type (P-type) on the drift region 1, and an emitter region 3 of the first conductivity type (N-type) on the base region 2. A first trench 21 is formed through the base region 2, and the emitter region 3 is formed on a side wall of the first trench 21.

A collector region 4 of the second conductivity type (P-type) is provided below the drift region 1, and a field stop (FS) layer 5 of the first conductivity type (N-type) with a higher impurity concentration than the drift region 1 is provided between the drift region 1 and the collector region 4. Between the first trench 21 adjacent to the emitter region 3 at the side wall and the adjacent first trench 21, a contact region 9 of the second conductivity type (P-type) with a higher impurity concentration than the base region 2 is provided. A carrier storage layer 8 of the first conductivity type (N-type) with a higher impurity concentration than the drift region 1 is provided between the base region 2 and the drift region 1.

A control electrode 15 is provided in the first trench 21 through an insulating film 17. A first main electrode 13 is electrically connected with low-resistance to the emitter region 3, and a second main electrode 14 is electrically connected with low-resistance to the collector region 4. The contact region 9 may be electrically connected to the first main electrode 13.

The diode region 20 includes the drift region 1 and an anode region 6 of the second conductivity type (P-type) on the drift region 1. A second trench 22 is formed through the anode region 6. A semiconductor region 11 of the second conductivity type (P-type) is formed on a sidewall of the second trench 22. Between adjacent second trenches 22, a semiconductor region 12 of the first conductivity type (N-type) with a higher impurity concentration than the drift region 1 is provided adjacent to the semiconductor region 11. A cathode contact region 7 of the first conductivity type (N-type) with a higher impurity concentration than the FS layer 5 is provided below the drift region 1 in place of the collector region. The cathode contact region 7 is provided below the FS layer 5.

An auxiliary electrode 16 is provided in the second trench 22 through an insulating film 18. In the semiconductor device of FIG. 1, the auxiliary electrode 16 is electrically connected to the first main electrode 13. The first main electrode 13 is electrically connected with low-resistance to the semiconductor region 11, and the second main electrode 14 is electrically connected with low-resistance to the cathode contact region 7. The semiconductor region 12 is electrically connected to the first main electrode 13.

Figure 2:
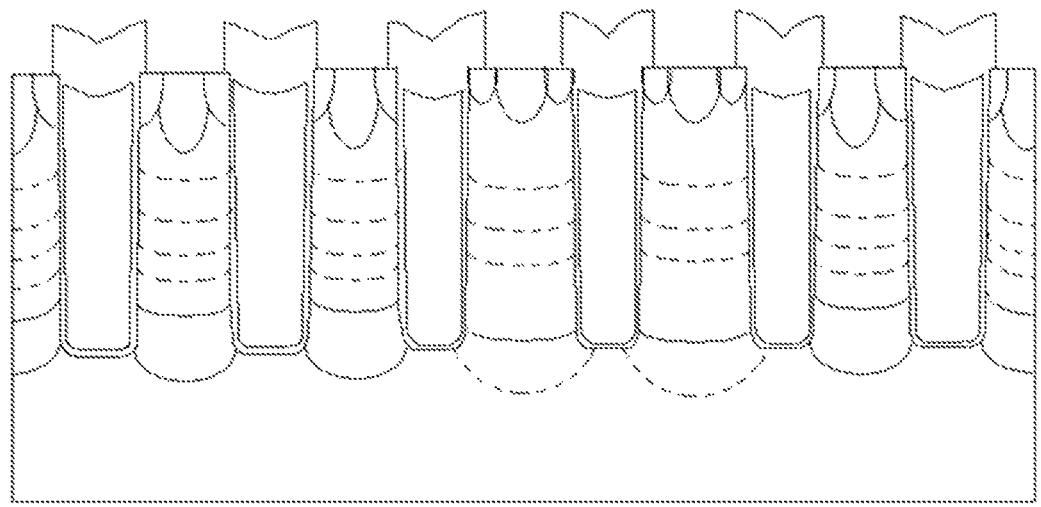
FIG. 2 is a cross-sectional view illustrating an impurity concentration distribution according to one or more embodiments.

The impurity concentration of the anode region 6 of the diode region 20 is lower than the impurity concentration of the base region 2 of the IGBT region 19. In other words, the maximum impurity concentration of the anode region 6 is lower than the maximum impurity concentration of the base region 2 of the IGBT region 19. The impurity concentration of the base region 2 of the IGBT region 19 may be relatively high because of problems with changes in short-circuit tolerance and an IGBT threshold. However, when the impurity concentration of the anode region 6 of the diode region 20 is similarly increased, the reverse direction peak current (Irpeak) increases. Therefore, the impurity concentration of the base region 2 and the impurity concentration of the anode region 6 of the diode region 20 are not the same, and the impurity concentration of the anode region 6 is lower than the impurity concentration of the base region 2 of the IGBT region 19. As a result, the semiconductor device does not reduce the reverse direction peak current (Irpeak) of the reverse conduction IGBT without reducing the threshold of the IGBT and load short-circuit tolerance. The anode region 6 is formed by selective diffusion, for example. When an amount of ion implantation from a top side of a region to be as the anode region 6 is limited by a mask and the anode region 6 is formed by oblique ion implantation from a sidewall of the second trench 22 and thermal diffusion, ion implantation to form the anode region 6 and ion implantation to form the base region 2 may be performed simultaneously. An impurity concentration distribution of the semiconductor device according to one or more embodiments is illustrated in FIG. 2.

Figure 4:
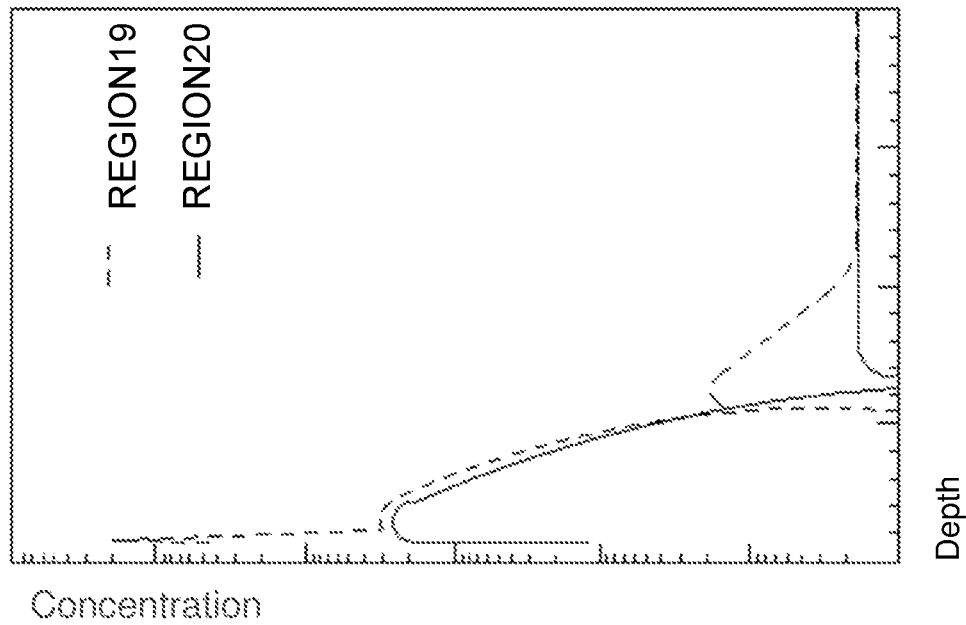
FIG. 4 is a diagram illustrating the impurity concentration in an IGBT region represented by a dotted line and an impurity concentration in a diode region represented by a solid line in a semiconductor device of a related technology.
Figure 3:
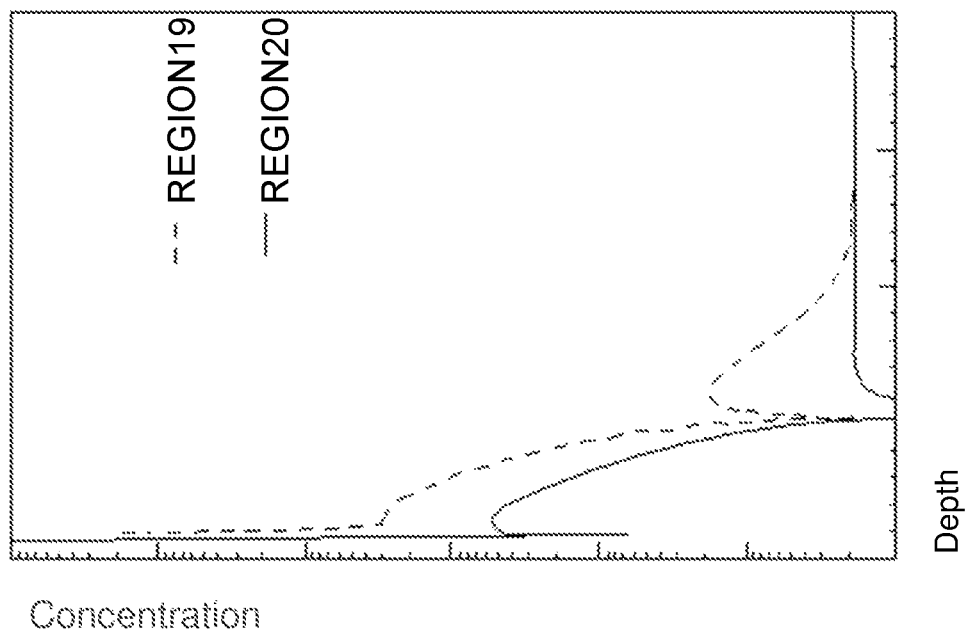
FIG. 3 is a diagram illustrating the impurity concentration in an IGBT region represented by a dotted line and an impurity concentration in a diode region represented by a solid line in a semiconductor device according to one or more embodiments.

The impurity concentration distribution of the IGBT region 19 and the diode region 20 in the drift region 1 and above the drift region 1 of the semiconductor according to one or more embodiments is illustrated in FIG. 3. Also, FIG. 4 illustrates the impurity concentration distribution in the drift region 1 and above the drift region 1 of the traditional IGBT region and diode region as a comparative example. In FIG. 3 and FIG. 4, the dotted line indicates the impurity concentration distribution from a top surface of the emitter region 3 to the drift region 1 in the IGBT region 19, and the solid line indicates the impurity concentration distribution from the semiconductor region 11 to the drift region 1 in the diode region 20. In the semiconductor device according to one or more embodiments, as illustrated in FIG. 2 and FIG. 3, the impurity concentration in the anode region 6 is lower than the impurity concentration in the base region 2 of the IGBT region 19, and the impurity concentration of the anode region 6 is in the range of $1/20$ to $1/2$ of the impurity concentration of the base region 2.

The (N-type) carrier storage layer 8 may be provided in the IGBT region 19, but the (N-type) carrier storage layer 8 may not be provided between the anode region 6 and the drift region 1 of the diode region 20. When the carrier storage layer 8 is provided in the diode region 20, the carrier storage layer 8 is generally formed by ion implantation from a substrate surface side; therefore, the impurity concentration in the region where the anode region 6 is formed is higher than the impurity concentration of the carrier storage layer 8. As a result, it is difficult to stably form the anode region 6 with a P-type and low impurity concentration. Thus, the carrier storage layer 8 may not be provided in the diode region 20. Furthermore, when the carrier storage layer 8 is provided in the diode region 20, a depletion layer is more likely to spread to a side of the anode region 6. The depletion layer is merged with the fact that the anode region 6 is made with low impurity concentration, which makes the depletion layer spread more easily. Hence, the carrier storage layer 8 may not be provided in the diode region 20.

When the anode region 6 and the first main electrode 13 are contacted, the contact resistance increases and the forward voltage of the diode region 20 increases as the anode region 6 has a low impurity concentration. Therefore, the semiconductor region 11 with a higher impurity concentration than the anode region 6 is formed on a side surface of the second trench 22, and the semiconductor region 11 and the first main electrode 13 are electrically connected. Thereby, an increase in the forward voltage of the diode region 20 may be suppressed. When the impurity concentration of the anode region 6 of the diode region 20 is reduced, the depletion layer may easily extend on the side surface of the second trench 22 of the diode region 20. Therefore, the semiconductor region 11 may serve as a channel stopper to prevent the depletion layer reaching the semiconductor region 11 from spreading further. The insulating film 18 extending from the second trench 22 is formed on the top surface of the semiconductor region 11 from an opening of the second trench 22. The insulating film 18 is formed so that the anode region 6 is not in direct contact with the first main electrode 13 in the vicinity of the opening of the second trench 22, and the pressure resistance of the diode region 20 may be improved.

The auxiliary electrode 16 may be formed of N-type polysilicon same as the control electrode 15.

When the semiconductor region 11 is provided, the P-type impurity concentration in the diode region 20 increases. Therefore, the N-type semiconductor region 12 is provided on the surface of the diode region 20. The N-type semiconductor region 12 may be formed in the same process as the emitter region 3 and has a higher impurity concentration than the drift region 1 and the carrier storage layer 8. As a result, the diode region 20 may maintain fewer holes (carriers) on the surface of the diode region 20 when a diode is operated in the forward direction. In order to keep the hole concentration on the surface of the diode region 20 low, the impurity concentration of the semiconductor region 12 may be formed to be higher and deeper than the P-type semiconductor region 11. Therefore, the diode region 20 may maintain fewer holes on the surface of the diode region 20, and the reverse direction peak current (Irpeak) of the reverse conduction IGBT may be reduced.

As described above, the semiconductor device according to one or more examples may reduce the reverse direction peak current (Irpeak) of the reverse conduction IGBT without reducing the threshold voltage of the IGBT and load short-circuit tolerance.

The invention claimed is:

1. A semiconductor device comprising:
   an IGBT region comprising:
      a first semiconductor region of a first conductivity type;
      a second semiconductor region of a second conductivity type arranged on the first semiconductor region;
      a third semiconductor region of the first conductivity type arranged on the second semiconductor region;
      a fourth semiconductor region of the second conductivity type arranged on the first semiconductor region and opposite the second semiconductor region; and
      a control electrode that is arranged via an insulating film opposite the second semiconductor region; and
   a diode region comprising a fifth semiconductor region of the second conductivity type on the first semiconductor region, wherein
   an impurity concentration of the fifth semiconductor region is lower than the impurity concentration of the second semiconductor region,
   the control electrode is arranged in a first trench through the second semiconductor region, and
   the semiconductor device further comprises:
      an auxiliary electrode that is insulated within a second trench so as to penetrate the fifth semiconductor region;
      a seventh semiconductor region of the second conductivity type that is arranged on a side surface of the second trench on the fifth semiconductor region and has a higher impurity concentration than the fifth semiconductor region; and
      an eighth semiconductor region of the first conductivity type that is arranged on the fifth semiconductor region and adjacent to the seventh-semiconductor region and has a higher impurity concentration than the first semiconductor region, wherein
      an interface between the eighth semiconductor region and the fifth semiconductor region is located deeper than the interface between the seventh semiconductor region and the fifth semiconductor region.

2. The semiconductor device according to claim 1, further comprising
   a sixth semiconductor region with a higher impurity concentration than the first semiconductor region arranged between the first semiconductor region and the second semiconductor region, wherein
   the sixth semiconductor region is not arranged between the first semiconductor region and the fifth semiconductor region.

3. The semiconductor device according to claim 1, wherein
   the auxiliary electrode includes a polysilicon of the first conductivity type.

4. A semiconductor device comprising:
   an IGBT region comprising:
      a first semiconductor region of a first conductivity type;
      a second semiconductor region of a second conductivity type arranged on the first semiconductor region;
      a third semiconductor region of the first conductivity type arranged on the second semiconductor region;
      a fourth semiconductor region of the second conductivity type arranged on the first semiconductor region and opposite the second semiconductor region; and
      a control electrode that is arranged via an insulating film opposite the second semiconductor region; and
   a diode region comprising a fifth semiconductor region of the second conductivity type on the first semiconductor region, wherein
   the control electrode is arranged in a first trench through the second semiconductor region, and
   the semiconductor device further comprises:
      an auxiliary electrode that is insulated within a second trench so as to penetrate the fifth semiconductor region;
      a seventh semiconductor region of the second conductivity type that is arranged on a side surface of the second trench on the fifth semiconductor region and has a higher impurity concentration than the fifth semiconductor region; and
      an eighth semiconductor region of the first conductivity type that is arranged on the fifth semiconductor region and adjacent to the seventh-semiconductor region and has a higher impurity concentration than the first semiconductor region, wherein
      an interface between the eighth semiconductor region and the fifth semiconductor region is located deeper than the interface between the seventh semiconductor region and the fifth semiconductor region.

* * * * *